United States Patent
Yu et al.

(10) Patent No.: US 7,679,220 B2
(45) Date of Patent: Mar. 16, 2010

(54) ELECTRONIC TIME SWITCH CONTROL CIRCUIT

(75) Inventors: Hong-Chang Yu, Shenzhen (CN);
Xiao-Lin Gan, Shenzhen (CN);
Yu-Kuang Ho, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 147 days.

(21) Appl. No.: 11/861,312

(22) Filed: Sep. 26, 2007

(65) Prior Publication Data

US 2009/0021086 A1    Jan. 22, 2009

(30) Foreign Application Priority Data

Jul. 17, 2007    (CN) .......................... 2007 1 0201093

(51) Int. Cl.
*H01H 9/56* (2006.01)
*H01H 9/00* (2006.01)
*H01H 9/54* (2006.01)

(52) U.S. Cl. ...................................... 307/112; 307/139

(58) Field of Classification Search ................. 307/112, 307/139
See application file for complete search history.

(56) References Cited

U.S. PATENT DOCUMENTS

| 3,745,382 | A | * | 7/1973 | Hoge et al. | 327/402 |
| 4,992,702 | A | * | 2/1991 | Shimizu et al. | 315/219 |
| 5,130,561 | A | * | 7/1992 | Elliott et al. | 307/31 |
| 5,161,241 | A | * | 11/1992 | Kanai | 363/65 |
| 5,309,348 | A | * | 5/1994 | Leu | 363/71 |
| 5,435,894 | A | * | 7/1995 | Hayakawa | 205/744 |
| 5,910,890 | A | * | 6/1999 | Hansen et al. | 363/41 |
| 5,930,131 | A | * | 7/1999 | Feng | 363/56.03 |
| 6,274,988 | B1 | * | 8/2001 | De Vries | 315/307 |
| 6,820,018 | B2 | | 11/2004 | Akitaya et al. | |
| 2002/0008501 | A1 | * | 1/2002 | Telefus et al. | 323/282 |
| 2006/0152874 | A1 | * | 7/2006 | Young | 361/93.1 |
| 2006/0221650 | A1 | * | 10/2006 | Yamada | 363/21.01 |

* cited by examiner

*Primary Examiner*—Stephen W Jackson
*Assistant Examiner*—Adi Amrany
(74) *Attorney, Agent, or Firm*—Frank R. Niranjan

(57) ABSTRACT

An electronic time switch control circuit includes a power supply, an oscillation period control module, an oscillator, and a switch control module. The power supply supplies power to the oscillation period module, the oscillator, and the switch control module. The oscillation period module supplies periodic signals to the oscillator. The oscillator alternately outputs two kinds of control signals to the switch control module according to the periodic signals. The switch control module receives the two kinds of control signals, and correspondingly controls an electronic product to be turned on and off repeatedly.

20 Claims, 2 Drawing Sheets

ELECTRONIC TIME SWITCH CONTROL CIRCUIT

BACKGROUND

1. Field of the Invention

The present invention relates to control circuits, and particularly to an electronic time switch control circuit.

2. Description of Related Art

Nowadays, consumers have high expectations for the electronic products they buy, so the makers of these products have to test the electronic products after they make them. And the testing includes switch testing.

At present, the makers usually test the electronic products manually or using a machine which includes many costly chips. But it costs much time to test the electronic products manually, and the testing results are not exact, and using the machine is expensive.

What is needed, therefore, is an electronic time switch control circuit which can solve the above the problems.

SUMMARY

An embodiment of an electronic time switch control circuit includes a power supply, an oscillation period control module, an oscillator, and a switch control module. The power supply supplies power to the oscillation period control module, the oscillator, and the switch control module. The oscillation period control module supplies periodic signals to the oscillator. The oscillator outputs two kinds of control signals to the switch control module according to the periodic signals. The switch control module receives the two different control signals from the oscillator, and correspondingly controls an electronic product to be turned on and off repeatedly.

Other advantages and novel features will become more apparent from the following detailed description when taken in conjunction with the accompanying drawings, in which:

DETAILED DESCRIPTION

Figure 1:
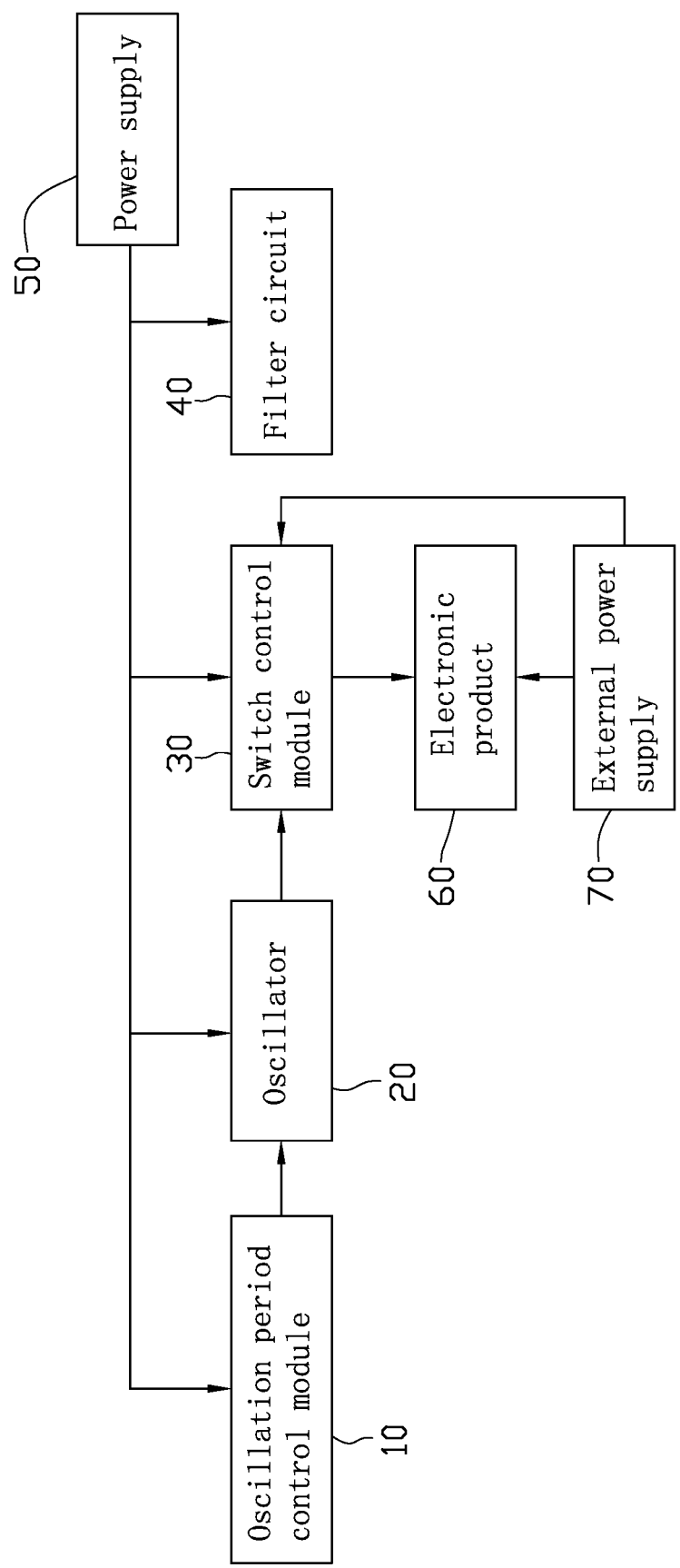
FIG. 1 is a block diagram of one embodiment of an electronic time switch control circuit for testing an electronic product in accordance with the present invention.

Referring to FIG. 1, an electronic time switch control circuit in accordance with an embodiment of the present invention is provided to alternately turn on or off an electronic product 60. The electronic time switch control circuit includes an oscillation period control module 10, an oscillator 20, a switch control module 30, and a power supply 50. The oscillator 20 receives the periodic signals that are provided by the oscillation period control module 10, and alternately outputs two different kinds of control signals to the switch control module 30 according to the periodic signals. The switch control module 30 will be turned on or off according to the different periodic signals. In addition, a filter circuit 40 is connected to the power supply 50 to help the power supply 50 output power smoothly. The power supply 50 supplies power to the oscillation period control module 10, the oscillator 20, and the switch control module 30 via a control switch S1 (see FIG. 2).

The switch control module 30, the electronic product 60, and an external power supply 70 are connected in series to form a loop circuit. When the switch control module 30 is turned on, the electronic product 60, the external power supply 70, and the switch control module 30 make up a circuit, so that the electronic product 60 is turned on. Correspondingly, the circuit is opened, and the electronic product 60 is turned off.

Figure 2:
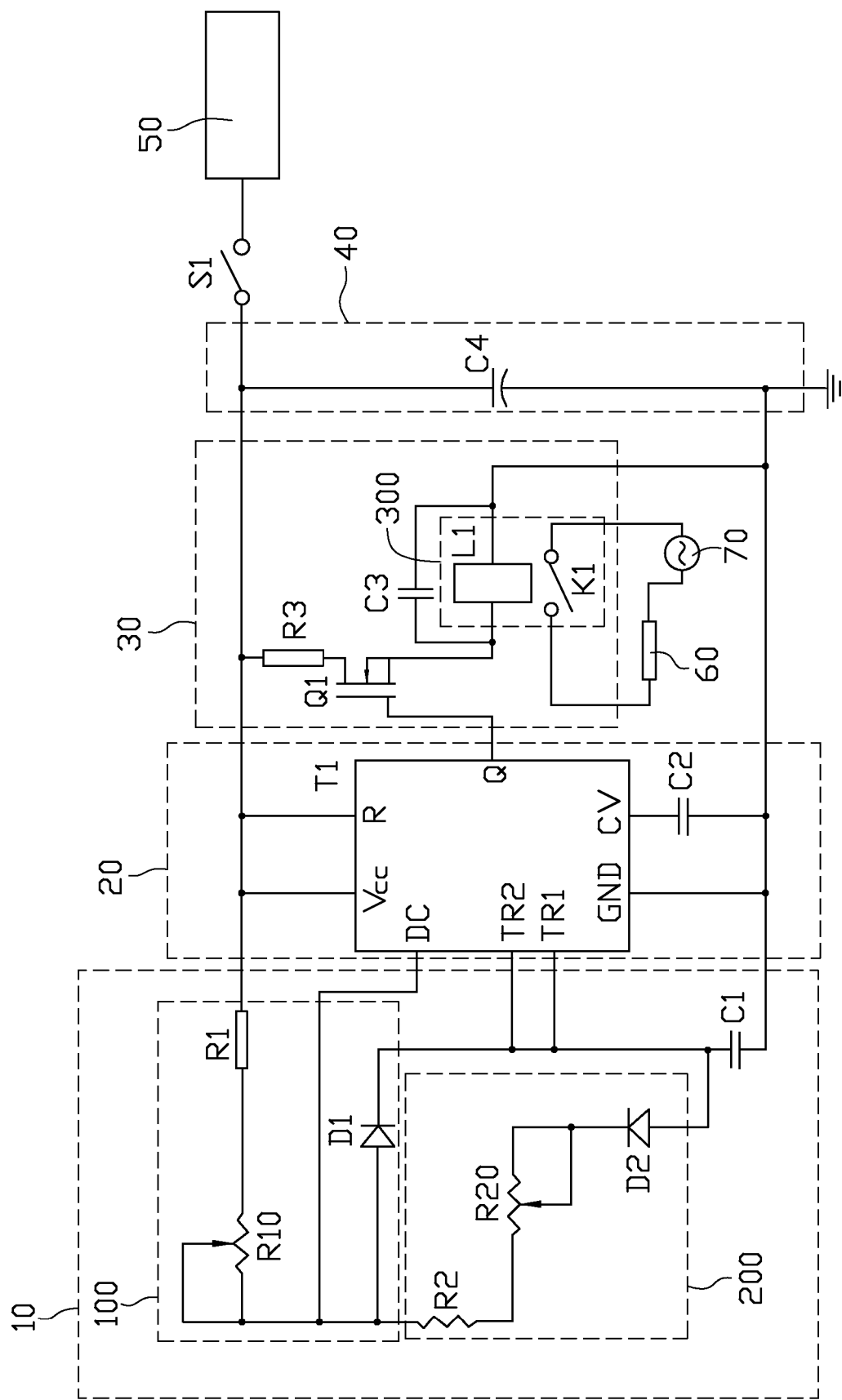
FIG. 2 is a circuit diagram of FIG. 1.

Referring also to FIG. 2, the oscillation period control module 10 includes a charge circuit 100, a discharge circuit 200, and a first capacitor C1. The charge circuit 100 includes a first resistor R1, a first adjustable resistor R10, and a first diode D1. One end of the first resistor R1 is connected to an anode of the first diode D1 via the first adjustable resistor R10, and another end of the first resistor R1 is connected to the power supply 50 via the control switch S1. The discharge circuit 200 includes a second resistor R2, a second adjustable resistor R20, and a second diode D2. One end of the second resistor R2 is connected to a cathode of the second diode D2 via the second adjustable resistor R20, and another end of the second resistor R2 is connected to the anode of the first diode D1. A cathode of the first diode D1 and an anode of the second diode D2 are connected to ground via the first capacitor C1.

The oscillator 20 includes a 555 timer T1, and a second capacitor C2. The 555 timer T1 includes two trigger pins TR1 and TR2 connected to the cathode of the first diode D1, a control pin CV connected to ground via the second capacitor C2, an output pin Q connected to the switch control module 30, a reset pin R and a power pin Vcc connected to the power supply 50 via the switch S1, a discharge pin DC is connected to the anode of the first diode D1, and a ground pin GND connected to ground.

The switch control module 30 includes a relay 300, a MOS transistor Q1, a third resistor R3, and a third capacitor C3. The relay 300 includes an inductance coil L1, and a switch K1. A source of the MOS transistor Q1 is connected to ground via the inductance coil L1. A drain of the MOS transistor Q1 is connected to the power supply 50 via the third resistor R3 and the control switch S1 in sequence. A gate of the MOS transistor Q1 is connected to the output pin Q of the 555 timer T1. The switch K1, the electronic product 60, and the external power supply 70 are connected in series to form a loop circuit. The third capacitor C3 is connected in parallel with the inductance coil L1.

The filter circuit 40 includes a fourth capacitor C4. One end of the fourth capacitor C4 is connected to ground. Another end of the fourth capacitor C4 is connected to the power supply 50 via the control switch S1.

In this embodiment, a voltage of the power supply 50 is approximately 10V, resistances of the first resistor R1 and the second resistor R2 are approximately 28.5KΩ, max adjustable resistances of the first adjustable resistor R10 and the second adjustable resistor R20 are approximately 1.7MΩ, and a capacitance of the first capacitor C1 is approximately 50 μF.

When the control switch S1 is closed, the power supply 50 supplies power to the 555 timer T1 and the relay 300 via the filter circuit 40, simultaneously the power supply 50 charges the first capacitor C1 via the charge circuit 100. When the voltage of the two trigger pins TR1 and TR2 of the 555 timer T1 reaches ⅓ Vc (wherein Vc denotes a voltage of the power pin Vcc of the 555 timer, that is, the voltage of the power supply 50), the discharge pin DC and the output pin Q of the 555 timer T1 output high voltage. When the voltage of the two trigger pins TR1 and TR2 of the 555 timer T1 reaches ⅔ Vc, the discharge pin DC and the output pin Q of the 555 timer T1 output low voltage. In this embodiment, the voltage of the two trigger pins TR1 and TR2 of the 555 timer T1 are equal to the voltage of the first capacitor C1. Thus, when the voltage of the first capacitor C1 is charged to ⅓ Vc, the discharge pin DC and the output pin Q of the 555 timer T1 output high voltage, the MOS transistor Q1 is turned on, as a result, the switch K1 of the relay 300 is closed, and correspondingly, the electronic product 60 and the external power supply 70 make up a closed circuit, so that the electronic product 60 is turned on. When the voltage of the first capacitor C1 is charged to ⅔ Vc, the discharge pin DC and the output pin Q output low voltage, as a result, the MOS transistor Q1 is turned off, and the relay 300 is turned off. Correspondingly, the electronic product 60 and the external power supply 70 make up an open circuit, so that the electronic product 60 is turned off. Because of the low voltage of the discharge pin DC of the 555 timer T1, the first diode D1 is turned off, and the second diode D2 is turned on. As a result, the discharge circuit 200 works while the charge circuit 100 doesn't. The first capacitor C1 is discharged. When the voltage of the first capacitor C1 reduces to ⅓ Vc, the charge circuit 100 works on the first capacitor C1, and the discharge circuit 200 doesn't work again. As a result, the electronic product 60 is turned on again. Thus, the electronic product 60 is periodically turned on and off before the control switch S1 is turned off.

When the testing is over, the control switch S1 is turned off. In use, the open time and close time of the relay 300 can be adjusted via adjusting the resistances of the first adjustable resistor R10 and the second adjustable resistor R20. By using this electronic time switch control circuit, the electronic products can be tested quickly and easily, and the cost is low.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electronic time switch control circuit comprising:
    an oscillation period control module configured to generate periodic signals, wherein the oscillation period control module comprises a first capacitor, a charge circuit configured to charge the first capacitor, and a discharge circuit configured to discharge the first capacitor, the charge circuit comprises a first resistor, a first adjustable resistor, and a first diode, one end of the first resistor is connected to an anode of the first diode via the first adjustable resistor, and another end of the first resistor is connected to a power supply; wherein the discharge circuit includes a second resistor, a second adjustable resistor, and a second diode, one end of the second resistor is connected to a cathode of the second diode via the second adjustable resistor, and another end is connected to the anode of the first diode; a cathode of the first diode and an anode of the second diode are connected to ground via the first capacitor;
    an oscillator configured to receive the periodic signals from the oscillation period control module, and alternately output two kinds of control signals according to the periodic signals;
    a switch control module configured to receive the two kinds of control signals from the oscillator, and control an electronic product to be turned on and off repeatedly according to the control signals.

2. The electronic time switch control circuit as claimed in claim 1, wherein the oscillator comprises a timer, the timer comprises two trigger pins connected to the cathode of the first diode, a control pin connected to ground, an output pin connected to the switch control module, a reset pin and a power pin connected to the power supply, a discharge pin connected to the anode of the first diode, a ground pin connected to ground.

3. The electronic time switch control circuit as claimed in claim 2, wherein the timer is a 555 timer.

4. The electronic time switch control circuit as claimed in claim 2, wherein the oscillator comprises a second capacitor, the control pin of the timer is connected to ground via the second capacitor.

5. The electronic time switch control circuit as claimed in claim 1, wherein the switch control module comprises a relay, a transistor, and a third resistor; the relay comprises an inductance coil and a switch, one end of the inductance coil is connected to a source of the transistor, another end of the inductance coil is connected to ground, and a drain of the transistor is connected to the power supply via the third resistor, a gate of the transistor is connected to an output of the oscillator; one end of the switch is connected to one end of the electronic product, another end of the switch is connected to one end of an external power supply; another end of the electronic product is connected to another end of the external power supply.

6. The electronic time switch control circuit as claimed in claim 5, wherein the switch control module comprises a third capacitor, the third capacitor is connected in parallel with the inductance coil.

7. The electronic time switch control circuit as claimed in claim 1, further comprising a filter circuit, wherein one end of the filter circuit is connected to the power supply, and another end is connected to ground.

8. The electronic time switch control circuit as claimed in claim 1, further comprising a control switch, wherein the power supply supplies power to the oscillation period module, the oscillator, and the switch control module via the control switch.

9. An electronic time switch control circuit for repeatedly turning on and off an electronic product, comprising:
    an oscillation period control module comprising a capacitor, a charge circuit and a discharge circuit configured to periodically charge and discharge the capacitor such that an end of the capacitor generates periodic signals;
    an oscillator coupled to the end of the capacitor and configured to receive the periodic signals therefrom, and alternately output a high voltage control signal or a low voltage control signal according to the periodic signals;
    a switch control module configured to receive the control signals from the oscillator, and control the electronic product to be repeatedly turned on and off according to the control signals, wherein the switch control module comprises a transistor, and a relay which comprises an inductance coil and a switch, one end of the inductance coil is connected to a source of the transistor, another end of the inductance coil is connected to ground, and a drain of the transistor is connected to a power supply, a gate of the transistor is connected to an output of the oscillator, the switch is connected between the electronic product and an external power supply such that the electronic product, the external power supply and the switch cooperatively form a loop.

10. The electronic time switch control circuit as claimed in claim 9, wherein the charge circuit includes a first resistor, a first adjustable resistor, and a first diode, one end of the first resistor is connected to an anode of the first diode via the first adjustable resistor, and another end of the first resistor is connected to the power supply; wherein the discharge circuit includes a second resistor, a second adjustable resistor, and a second diode, one end of the second resistor is connected to a cathode of the second diode via the second adjustable resistor, and another end is connected to the anode of the first diode; a cathode of the first diode and an anode of the second diode are connected to ground via the capacitor.

11. The electronic time switch control circuit as claimed in claim 9, wherein the oscillator comprises a timer, the timer comprises two trigger pins connected to the cathode of the first diode, a control pin connected to ground, an output pin connected to the switch control module, a reset pin and a power pin connected to the power supply, a discharge pin connected to the anode of the first diode, a ground pin connected to ground.

12. The electronic time switch control circuit as claimed in claim 11, wherein the timer is a 555 timer.

13. The electronic time switch control circuit as claimed in claim 11, wherein the oscillator comprises a second capacitor, the control pin of the timer is connected to ground via the second capacitor.

14. The electronic time switch control circuit as claimed in claim 9, wherein the switch control module comprises a third capacitor, the third capacitor is connected in parallel with the inductance coil.

15. The electronic time switch control circuit as claimed in claim 9, further comprising a filter circuit, wherein one end of the filter circuit is connected to the power supply, and another end is connected to ground.

16. The electronic time switch control circuit as claimed in claim 9, further comprising a control switch, wherein the power supply supplies power to the oscillation period module, the oscillator, and the switch control module via the control switch.

17. An electronic time switch control circuit for repeatedly turning on and off an electronic product, comprising:
an oscillation period control module configured to generate periodic signals, wherein the oscillation period control module comprises a first capacitor, a charge circuit configured to charge the first capacitor, and a discharge circuit configured to discharge the first capacitor, the charge circuit comprises a first resistor and a first diode, a power supply charges the first capacitor via the first resistor and the first diode in series; wherein the discharge circuit includes a second resistor and a second diode, the first capacitor is discharged via the second diode and the second resistor in series;
an oscillator configured to receive the periodic signals from the oscillation period control module, and alternately output two kinds of control signals according to the periodic signals; and
a switch control module configured to receive the two kinds of control signals from the oscillator, and control an electronic product to be turned on and off repeatedly according to the control signals.

18. The electronic time switch control circuit as claimed in claim 17, wherein the charge circuit further comprises a first adjustable resistor connected between the first resistor and the first diode; wherein the discharge circuit further comprises a second adjustable resistor connected between the second resistor and the second diode.

19. The electronic time switch control circuit as claimed in claim 17, wherein the oscillator comprises a timer, the timer comprises two trigger pins connected to a cathode of the first diode, a control pin connected to ground, an output pin connected to the switch control module, a reset pin and a power pin connected to the power supply, a discharge pin connected to an anode of the first diode, a ground pin connected to ground.

20. The electronic time switch control circuit as claimed in claim 19, wherein the timer is a 555 timer.

* * * * *